United States Patent
Yamazaki et al.

(10) Patent No.: US 7,002,244 B2
(45) Date of Patent: Feb. 21, 2006

(54) SEMICONDUCTOR DEVICE

(75) Inventors: Misuk Yamazaki, Kashiwa (JP); Satoshi Matsuyoshi, Takahagi (JP); Chikara Makajima, Kitaibaraki (JP)

(73) Assignee: Hitachi, Ltd., Tokyo (JP)

( * ) Notice: Subject to any disclaimer, the term of this patent is extended or adjusted under 35 U.S.C. 154(b) by 18 days.

(21) Appl. No.: 10/750,857

(22) Filed: Jan. 5, 2004

(65) Prior Publication Data
US 2004/0135244 A1    Jul. 15, 2004

(30) Foreign Application Priority Data
Jan. 8, 2003    (JP) ............................. 2003-001687

(51) Int. Cl.
    H01L 23/48    (2006.01)
(52) U.S. Cl. ...................... 257/697; 257/780
(58) Field of Classification Search ............. 257/697, 257/780
    See application file for complete search history.

(56) References Cited

U.S. PATENT DOCUMENTS

| 4,970,570 | A | * | 11/1990 | Agarwala et al. | 257/735 |
| 5,005,069 | A | * | 4/1991 | Wasmer et al. | 257/687 |
| 5,655,213 | A | * | 8/1997 | Natarajan et al. | 428/568 |

FOREIGN PATENT DOCUMENTS

| JP | 4-229639 | 8/1992 |
| JP | 5-191956 | 7/1993 |
| JP | 7-221235 | 8/1995 |

* cited by examiner

Primary Examiner—Roy Potter
(74) Attorney, Agent, or Firm—Antonelli, Terry, Stout and Kraus, LLP.

(57) ABSTRACT

There is a need to provide a semiconductor device in which strain in a bonding member resulting from the difference in thermal deformation between a lead electrode and a semiconductor chip, which are electrically bonded to each other by the bonding member, is reduced for an improved thermal fatigue lifetime and the semiconductor chip has an improved current carrying capacity and enhanced heat dissipation. In the semiconductor device having the semiconductor chip mounted on the upper surface of the case electrode by using the bonding member and a lead electrode mounted on the upper surface of the semiconductor chip by using a bonding member, while an insulating member is filled in the space of the case electrode to seal a bonded portion, a trench is provided in the upper surface of the lead electrode to reduce large thermal strain occurring at the end portion of the bonding member due to the difference in linear expansion coefficients between the lead electrode and the semiconductor chip and improve the thermal fatigue lifetime. Consideration is also given to a reduction in variations in the thickness of a connecting member.

10 Claims, 5 Drawing Sheets

SEMICONDUCTOR DEVICE

FIELD OF THE INVENTION

The present invention relates to a semiconductor device for converting an AC output from an AC generator to a DC output.

BACKGROUND OF THE INVENTION

To provide a semiconductor device having electric properties which are not degraded over a long period of time even in a severe environment involving the repeated application of a plurality of thermal shocks, Japanese Patent Laid-Open No. H7(1995)-221235 discloses a structure in which a metal plate having a copper/iron-alloy/copper three-layer structure is interposed between a case electrode and a semiconductor chip. For the same purpose, Japanese Patent Laid-Open No. H4(1992)-229639 proposes a structure in which a semiconductor chip portion is sealed with an epoxy-based insulating member. The resin sealed structure aims at exerting a pressure in a direction perpendicular to the junction surface of the semiconductor chip on a case electrode by utilizing the shrinkage of the resin after molding. On the other hand, Japanese Patent Laid-Open No. H5(1993)-191956 discloses an embodiment which reduces a mechanical stress applied to a semiconductor chip to prevent a chip crack and reduce strain, while Japanese Patent Laid-Open No. H4(1992)-229639 discloses an embodiment which suppresses an increase in electric resistance and a reduction in heat value by retaining a sufficient current carrying capacity and thereby suppresses an abnormal increase in the temperature of a semiconductor chip.

[Patent Document 1]
  Japanese Patent Laid-Open No. H7(1995)-221235

[Patent Document 2]
  Japanese Patent Laid-Open No. H4(1992)-229639

[Patent Document 3]
  Japanese Patent Laid-Open No. H5(1993)-191956

However, the present inventors have found that it is difficult for the foregoing prior art technologies to provide a lead electrode disk with a sufficient current carrying capacity and reduce large thermal strain occurring at the end portion of the bonding member due to the difference in linear expansion coefficient between the lead electrode and the semiconductor chip.

Since the semiconductor device is mounted in the engine room of an automobile, high heat and variations in electric load on a vehicle exert extremely great influences including an increase in the heat value of a generator. In particular, the automobile is located in a severe environment where it experiences repeated cooling and heating over a wide temperature range resulting from a temperature difference between winter and summer or the like so that a semiconductor device with excellent heat dissipation and resistance to thermal fatigue is used preferably.

If a semiconductor device undergoes a plurality of repeated thermal shocks, strain resulting from the difference in linear expansion coefficient between technologies for constructing the semiconductor device is applied to a bonding member such as a solder, which may cause a crack in the bonding member. If a crack occurs, the cross-sectional area of the bonding member as a current carrying path is reduced and an electric resistance is increased so that heat generation is increased, while an amount of heat dissipation through the bonding member is reduced and the temperature of a semiconductor chip is abnormally increased. As a result, the bonding member is molten and the semiconductor chip reaches the heat resistance limit so that a rectifying function disappears. In some cases, the semiconductor device is brought into a breakdown state.

In a structure in which a semiconductor chip is bonded to an element having a linear expansion coefficient greatly different from that of the semiconductor chip by using a bonding member such as a solder, the above-mentioned strain is applied to the bonding member such as a solder on the both surfaces of the semiconductor chip so that it is more difficult to take anti-break down measures for such a structure than for a structure in which a semiconductor chip is wire-bonded.

For example, the embodiment disclosed in Japanese Patent Laid-Open No. H5(1993)-191956 is disadvantageous in that the addition of an intermediate member increases heat resistance to cause temperature elevation and the increased number of components and degraded assemblability lead to an increase in cost. On the other hand, the resin sealed structure disclosed in Japanese Patent Laid-Open No. H7(1995)-221235 or No. H4 (1992)-229639 uses the shrinkage of the resin after molding merely to exert the pressure on the case electrode. Therefore, it is not effective enough to reduce the strain in the bonding member resulting from the difference in linear expansion coefficient and the problem of the strain occurring in the bonding member has not been solved, though the effect of elongating the lifetime has been achieved slightly.

When a lead electrode and a semiconductor chip are connected to each other by using a bonding member such as a solder in such a conventional semiconductor device, a solder layer brought into a molten state by heating is affected by the weight of an object placed on the solder layer and by the surface tension of the molten solder so that variations occur in the thickness of the solder layer. If the solder layer is thinned, the localization of strain to the bonding member resulting from the difference in linear expansion coefficient between the lead electrode and the semiconductor chip is aggravated.

SUMMARY OF THE INVENTION

It is therefore an object of the present invention to provide a semiconductor device which can solve at least one of the foregoing problems.

To solve the foregoing problems, the present invention provides, in a semiconductor device comprising a semiconductor chip mounted on the upper surface of a case electrode by using a bonding member and a lead electrode mounted on the upper surface of the semiconductor chip by using a bonding member, the surface of the lead electrode opposite to the surface thereof opposing the semiconductor chip with a trench or a thinner portion. The lead electrode also has a region thicker than the thinner portion on the inner/outer circumferential side of the thinner portion. The arrangement reduces large thermal strain occurring at the end portion of the bonding member due to the difference in linear expansion coefficient between the lead electrode and the semiconductor chip without reducing the diameter of a lead electrode disk (the retention of a sufficiently large current carrying capacity), and thereby improves the thermal fatigue lifetime.

Specific examples are shown herein below.

(1) In a first inventive aspect, a semiconductor device comprises: a lead electrode connecting to a lead wire;

a case electrode having a projecting wall portion around a periphery thereof; and a semiconductor chip disposed between the lead electrode and the case electrode with a bonding member interposed therebetween, the lead electrode having a first thickness region formed in opposing relation to the semiconductor chip and a second thickness region formed externally of the first region to be thinner than the first thickness region.

In a second inventive aspect, the lead electrode preferably further has a third thickness region thicker than the second thickness region and located externally of the second thickness region.

In a third inventive aspect, the second thickness region preferably has a thickness equal to or smaller than a thickness of the bonding member located between the lead electrode and the semiconductor chip. In the arrangement, the provision of the trench may influence the rigidity, current carrying capacity, and heat dissipation of the lead electrode so that the thickness of the trench is preferably determined quantitatively.

In a fourth inventive aspect, the first thickness region preferably has a thickness equal to or smaller than three times a thickness of the bonding member located between the lead electrode and the semiconductor chip.

(2) In a fifth inventive aspect, a semiconductor device comprises: a lead electrode connecting to a lead wire; a case electrode having a wall portion on an outer peripheral portion thereof; and a semiconductor chip disposed between the lead electrode and the case electrode with a bonding member interposed therebetween, the lead electrode having a first region located in a range to be bonded to the semiconductor chip with the bonding member interposed therebetween, a second region thinner than the first region and located at a larger distance from the lead wire than the first region, and a third region thicker than the second region and located at a larger distance from the lead wire than the second region. In general, a lead electrode formed from a copper-based metal has a large linear expansion coefficient. Consequently, the portion of the bonding member between the semiconductor chip and the lead electrode which is closer to the lead electrode is deformed together with the lead electrode. However, the deformation of the portion of the lead electrode which is closer to the semiconductor chip is suppressed by the semiconductor chip so that large strain occurs at the end portion of the bonding member. The configuration, size, and thickness of the lead electrode are determined in consideration of the current carrying capacity and heat dissipation thereof. For the heat dissipation, the second region thinner than the center region around the lead wire and the first region thicker than the second region are provided in the edge portion of the lead electrode disk portion by focusing attention on the fact that the majority of heat is dissipated from the center portion of the lead electrode disk portion centering around the lead wire. That is, the lead electrode has been formed such that the provision of the trench reduces the amount of deformation of the bonding member which is deformed together with the lead electrode.

The arrangement reduces the difference in linear expansion coefficient between the semiconductor chip and lead electrode, even if the semiconductor device experiences repeated cooling and heating, and particularly reduces the amount of deformation of the end portion of the bonding member which is deformed together with the lead electrode. This leads to a reduction in thermal strain and an improvement in thermal fatigue lifetime. Because the height of the peripheral edge of the lead electrode disk is adjusted to be larger than the thickness of the first region, when the lead electrode and the semiconductor chip are bonded to each other by using a bonding member such as a solder, a solder layer brought into a molten state by heating is prevented from being placed on the lead electrode.

In a sixth inventive aspect, the second region is preferably formed such that a first distance in a direction connecting an edge of the second region closer to the lead wire and an outer circumferential edge of the second region is equal to or smaller than 0.5 times a distance between an edge of the third region closer to the lead wire and an outer circumferential edge of the third region.

In a seventh inventive aspect, the second region is preferably formed in a range corresponding to 0.5 times or less a distance between an edge of the third region closer to the lead wire and an outer circumferential edge of the third region.

In the arrangement, the amount of deformation of the bonding member with the deformation of the lead electrode is directly proportional to the volume of the bonding member in contact with the lead electrode. By providing the trench as the second region at a position at which the volume can be reduced greatly, while maintaining the electric properties, the present invention is allowed to achieve the maximum effects.

In an eighth inventive aspect, the first region is preferably formed to have a thickness equal to or less than three times a thickness of the bonding member bonded to the lead electrode. In the arrangement, if the thickness of the bonding member becomes larger than the thickness of the lead electrode, the difference in linear expansion coefficient between the lead electrode and the bonding member exerts a greater influence on strain under the influence of the difference in linear expansion coefficient between the lead electrode and the semiconductor chip on strain. Accordingly, the present invention is allowed to achieve the maximum effects by quantitatively determining the thickness of the first region based on the relationship between the thickness of the lead electrode and the thickness of the bonding member. The second region is characterized in that it is formed to have a width equal to or smaller than 90% the distance between the position corresponding to the outer edge of the lead electrode which is closest to the projecting wall portion and the lead wire. This limits the width of the trench under the same function of the second inventive aspect so that the effect of the trench is enhanced.

Thus, the present invention achieves a reduction in strain in the bonding member resulting from the difference in thermal deformation between the lead electrode and the semiconductor chip which are electrically bonded to each other by the bonding member. The present invention can also provide a semiconductor device in which variations in the thickness of the bonding member are reduced and the heat dissipation of a semiconductor chip has been enhanced.

DESCRIPTION OF THE PREFERRED EMBODIMENTS

Figure 1A:
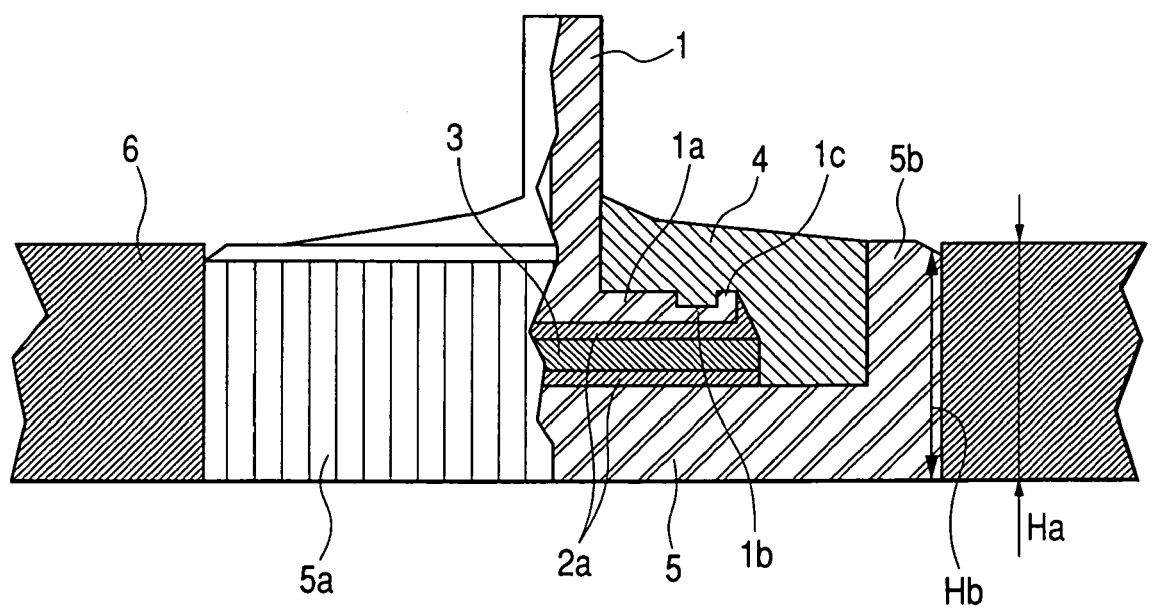
FIG. 1A is a vertical cross-sectional view of a principal portion of a semiconductor device according to a first embodiment of the present invention and FIG. 1B is a view for illustrating the lead electrode portion of FIG. 1A.

Referring to the drawings, the embodiments of the present invention will be described herein below.

Figure 1B:
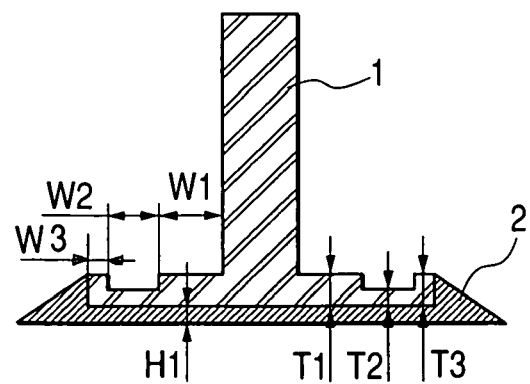

A semiconductor device according to a first embodiment of the present invention, which is shown in FIGS. 1A and 1B, has a lead electrode 1 connecting to a lead wire, a case electrode 5 having a projecting wall portion 5b around the periphery thereof, and a semiconductor chip 3 disposed between the lead electrode 1 and the case electrode 5 with a bonding member 2a interposed therebetween and having a rectifying function. The lead electrode 1 is formed to have a second region 1b as a second thickness region which is a thinner portion and a lead electrode disk edge portion 1c as a first thickness region thicker than the second region 1b and located externally of the second region 1b. Alternatively, a first region 1a as the first thickness region thicker than the second region is formed closer to the lead wire. The second region 1b is formed to have a thickness equal to or smaller than the thickness of the bonding member 2a. The bonding member 2a is extending to partly cover the outer circumferential side surface of the lead electrode 1.

The structure shows an example in which the semiconductor chip 3 is bonded directly to the case electrode 5 with the bonding member 2a interposed therebetween for enhanced heat dissipation. Each of the lead electrode 1 and the case electrode 5 is formed from, e.g., a copper-based metal or an iron-based metal. If each of these electrodes is formed from, e.g., a copper-based metal, the linear expansion coefficient thereof is about 17 ppm/° C., while the linear expansion coefficient of the semiconductor chip 3 is about 3 ppm/° C. Because of the large difference between the respective linear expansion coefficients of the semiconductor chip 3 and the lead electrode 1, the portion of the bonding member 2a between the semiconductor chip 3 and the lead electrode 1 which is closer to the lead electrode 1 is deformed together with the lead electrode 1. However, the deformation of the portion of the bonding member 2a closer to the semiconductor chip 3 is suppressed by the semiconductor chip 3 so that large strain occurs at the end portion of the bonding member 2a. For this reason, the lead electrode 1 has the first region 1a closer to the lead wire and the second region 1b thinner than the first region 1a and located at a larger distance from the lead wire than the first disk region 1a. The lead electrode 1 also has a lead electrode disk edge portion 1c thicker than the second region 1b and located externally of the second region 1b, whereby the deformation of the bonding member 2a, which is deformed together with the lead electrode 1, is reduced. This also suppresses strain at the end portion.

Figure 2:
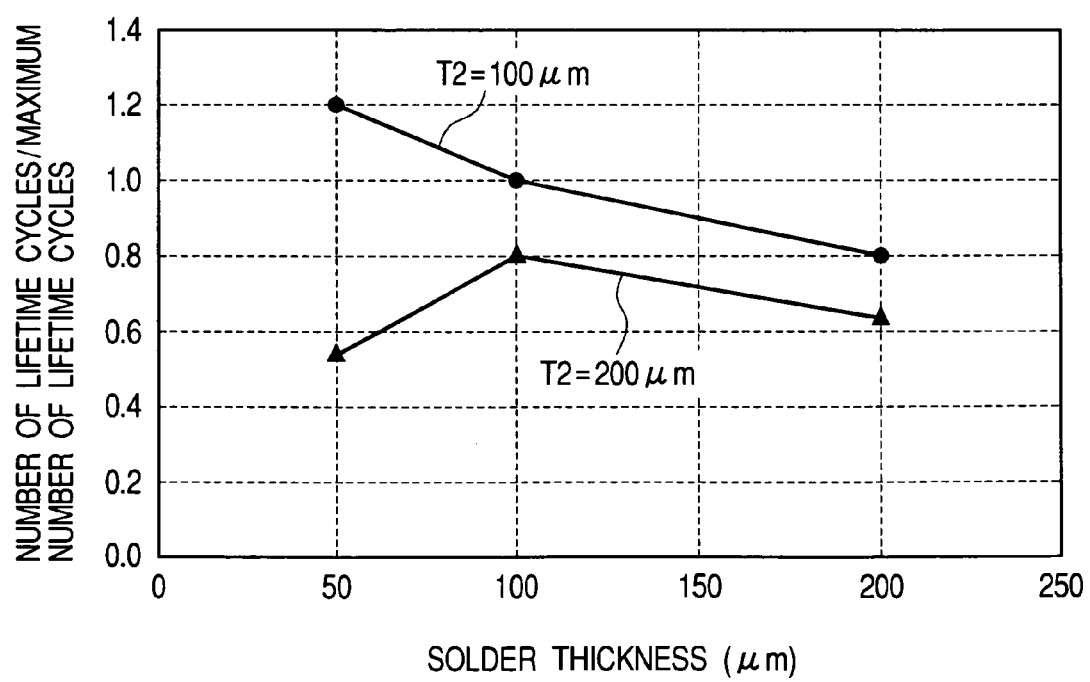
FIG. 2 is a graph showing a relationship between the difference between solder thickness and lead thickness and strain range/maximum strain range.

The graph shown in FIG. 2 is obtained by varying the thickness T2 of the second region which is a trench provided in the lead electrode 1 and the thickness H1 of the bonding member such as a solder and determining a relationship between the range of strain/the maximum range of strain at a given temperature and the thickness H1 of the bonding member 2a/the thickness T2 of the lead electrode. Although the second region 1b of the semiconductor device according to the first embodiment is formed to have the thickness T2 equal to or smaller than the thickness H1 of the bonding member 2a, if the thickness H1 of the bonding member 2a becomes larger than the thickness T2 of the lead electrode, the difference in linear expansion coefficient between the lead electrode 1 and the bonding member 2a exerts a greater influence on strain under the influence of the difference in linear expansion coefficient between the lead electrode and the semiconductor chip 3 on strain.

From the relationship between the thickness of the lead electrode 1 and the thickness of the bonding member 2a, it will be understood that the first embodiment can achieve the maximum effects when the thickness of the first region 1a of the lead electrode 1 is 0.5 times the thickness H1 of the bonding member 2a. Therefore, the first region 1a preferably has a thickness in the range around the value (e.g., not less than 0.3 times and not more than 0.7 times the thickness H1 of the bonding member 2a).

In addition, the second region 1b of the lead electrode 1 according to the first embodiment has been formed to have the thickness T2 equal to or smaller than the thickness H1 of the bonding member 2 such that the deformation of the bonding member 2, which is deformed together with the lead electrode 1, is reduced. In short, the thickness T2 of the second region 1b of the lead electrode 1 according to the first embodiment is preferably minimized for a reduction in the difference in linear expansion coefficient. The thickness T2 of the second region 1b of the lead electrode 1 can be determined in correspondence with the thickness T3 of the lead disk edge portion 1c of the lead electrode 1. For the retention of the bonding function, the thickness H1 of the bonding member 2a is adjusted to be at least equal to or less than the thickness T3 of the lead disk edge portion 1c of the lead electrode 1. The second region 1b of the lead electrode 1 according to the first embodiment is preferably formed to have the thickness T2 equal to or smaller than the thickness H1 of the bonding member. On the other hand, the thickness T3 of the lead disk edge portion 1c of the lead electrode 1 is adjusted to be larger than the thickness T2 of the second region 1b. In the resultant state, a trench is formed in a direction along the outer circumference of the lead electrode 1.

Since the lead electrode edge portion 1c is provided on the outer circumferential side of the thinner second region 1b, a configuration which prevents, when the lead electrode 1 and the semiconductor chip 3 are bonded to each other by using the bonding member 2a such as a solder, the bonding layer 2a composed of a solder brought into a molten state by heating or the like from being placed on the lead electrode is provided. This reduces the difference between the respective linear expansion coefficients above and below the bonding member and reduces variations in the thickness of the bonding member by providing the lead electrode disk edge portion with a certain degree of thickness. The lead electrode disk edge portion 1c is preferably formed to have the thickness T3 not less than the thickness H1 of the bonding member and not more than three times the thickness H1 of the bonding member in terms of actual effectiveness. Although the thickness T3 of the lead electrode disk edge portion 1c is preferably minimized in consideration of a reduction in the difference in linear expansion coefficient, which is the primary object of the present invention, the thickness T3 should beat least equal to or more than the thickness H1 of the bonding member for the retention of the bonding function. If the thickness T3 is equal to or more than the thickness H1 of the bonding member at the maximum, the probability of the bonding member 2a placed on the lead electrode disk edge portion 1c is eliminated.

As a result, the difference between the respective linear expansion coefficients above and below the bonding member can be reduced and variations in the thickness of the bonding member can be reduced by providing the lead electrode disk edge portion 1c with a-certain degree of thickness. This leads to a reduction in thermal strain at the end portion of the bonding member 2a and an improvement in thermal fatigue lifetime. The width W2 of the second region 1b is formed to be equal to or smaller than 0.5 times the distance W1 between the edge of the first region 1a of the lead electrode 1 which is closer to the lead wire and the outer circumferential edge thereof. Although the amount of deformation of the bonding member 2a with the deformation of the lead electrode 1 is directly proportional to the volume of the bonding member 2a in contact with the lead electrode 1, the present invention is allowed to achieve the maximum effects by providing the trench as the second region at the position at which the volume can be reduced greatly, while maintaining the electric properties.

The semiconductor device according to the first embodiment has a portion filled with the insulating member 4 in a region surrounded by the projecting wall portion 5b of the case electrode 5. The insulating member 4 is made of a flexible rubber material such as silicone rubber. The flexible rubber material has a rigidity of 1 MPa to 3 MPa at a room temperature (25° C.) and retains a rigidity of 2 MPa to 4 MPa even at a high temperature (200° C.) with no degradation of the physical property value thereof so that it withstands a long period of use. Since the rigidity of the insulating member is low, a stress given by the deformation of the case electrode 5 to the semiconductor chip 3 when a heat radiating plate 6 is mechanically fixed to the outer peripheral portion of the case electrode 5 by using the insulating member 4 can be reduced. If consideration is given to the fact that the strength of organic rubber such as a resin having a mechanical strength higher than that of the silicone rubber at a room temperature is mostly degraded at high temperatures (150 to 200° C. or more) and the superiority relationship between the silicone rubber and the organic rubber is reversed, the flexible rubber material can elongate the lifetime of the insulating member compared with the resin or the like.

The semiconductor device according to the first embodiment is characterized in that the projecting wall 5b of the portion 5a in contact with the heat radiating plate 6 is formed to have a height Hb equal to or smaller than the thickness Ha of the heat radiating plate 6 which is provided on the outer peripheral side of the semiconductor device. If the semiconductor device is mounted in the engine room of an automobile, the arrangement can prevent the case electrode 5 fixed to the heat radiating plate 6 from coming off under a shock from the outside or the like.

The case electrode 5 of the semiconductor device according to the first embodiment is formed from zirconium copper. In general, the yield stress value of zirconium copper, which is 427 MPa, is double or more the yield stress value of pure copper, which is 207 MPa, so that, when the outer peripheral portion 5a of the case electrode 5 is mechanically fixed to the heat radiating plate 6 by press fitting, the influence of the deformation of the case electrode 5 on the deformation of the semiconductor chip 3 is reduced.

Thus, the present embodiment can reduce strain in the bonding member 2a resulting from the difference in thermal deformation between the lead electrode 1 and the semiconductor chip 3 which are electrically bonded to each other by the bonding member 2a and improve the thermal fatigue lifetime, while contributing to the implementation of a semiconductor device having a semiconductor chip 3 with an improved current carrying capacity and enhanced heat dissipation.

Figure 3A:
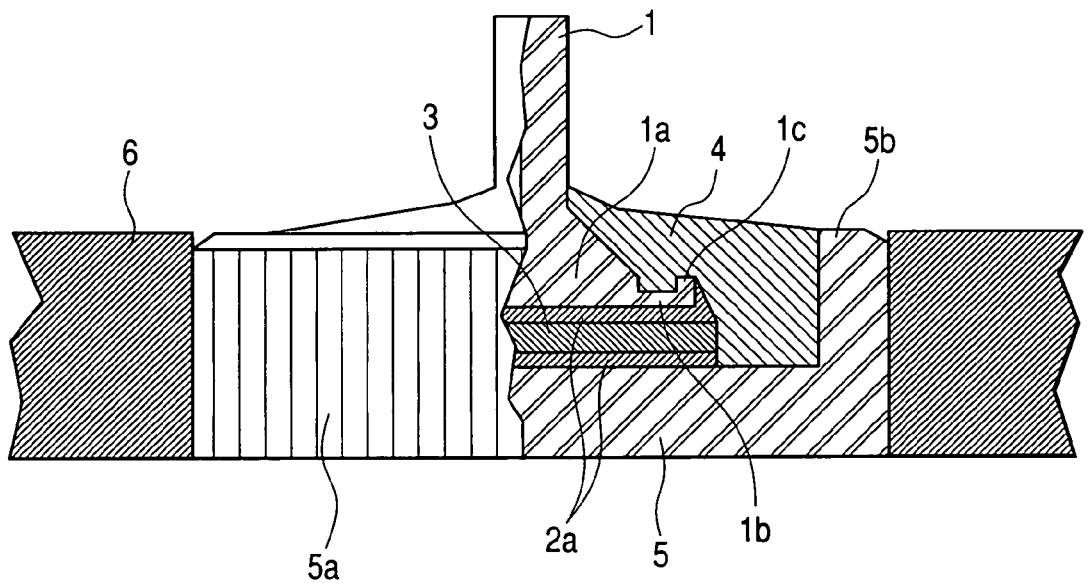
FIG. 3A is a vertical cross-sectional view of a principal portion of a semiconductor device according to a second embodiment of the present invention and FIG. 3B is a view for illustrating the lead electrode portion of FIG. 3A.
Figure 3B:
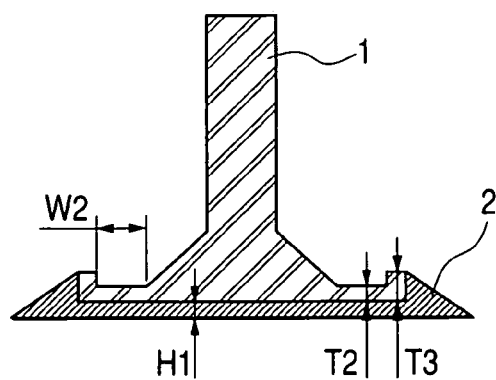

FIGS. 3A and 3B show a semiconductor device according to a second embodiment of the present invention. The second embodiment has basically the same structure as the first embodiment but is characterized in that the first region 1a closer to the lead wire in the first embodiment is formed to have a thickness which gradually decreases outwardly with distance from the edge closer to the lead wire and with approach toward the second region 1b having the width W2. The arrangement efficiently reduces a heat-induced load placed on the lead electrode 1.

Figure 4:
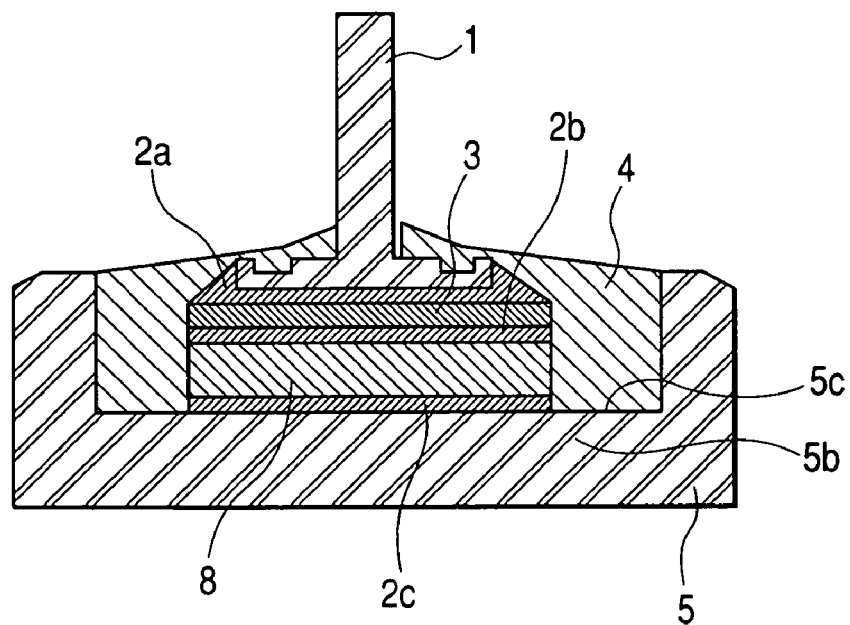
FIG. 4 is a vertical cross-sectional view of a principal portion of a semiconductor device according to a third embodiment of the present invention.

As shown in FIG. 4, in a semiconductor device according to a third embodiment of the present invention, the semiconductor chip 3, the lead electrode 1, the case electrode 5, the bonding member 2a between the lead electrode 1 and the semiconductor chip 3, the bonding member 2b between the semiconductor chip 3 and a metal plate 8 having a copper/iron-alloy/copper three layer structure, and the bonding member 2c between the metal plate 8 and the case electrode 5 are sealed with the insulating member 4 which is formed from a flexible rubber material. The third embodiment is basically the same as the first embodiment except that the semiconductor chip 3 is bonded to the case electrode 5 with the metal plate 8 interposed therebetween. By interposing the metal plate 8 in the copper/iron-alloy/copper three layer structure having an intermediate value between the respective linear expansion coefficients of the semiconductor chip 3 and the case electrode 5 therebetween, the arrangement can achieve a reduction in thermal strain.

Figure 5:
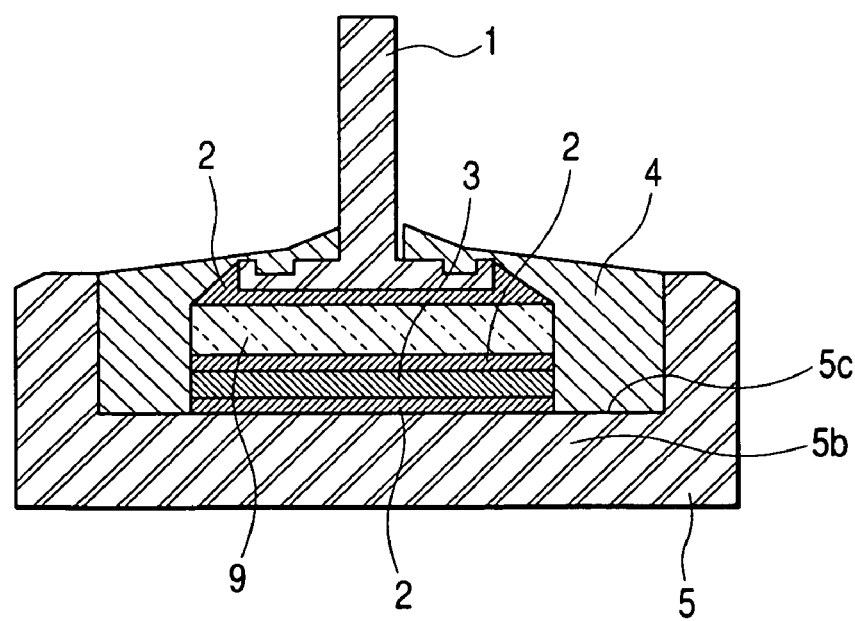
FIG. 5 is a vertical cross-sectional view of a principal portion of a semiconductor device according to a fourth embodiment of the present invention.

A semiconductor device according to a fourth embodiment of the present invention shown in FIG. 5 has the same structure as the semiconductor device according to the first embodiment but it is characterized in that a metal plate 9 is provided between the lead electrode 1 and the semiconductor chip 3. The metal plate 9 is characterized in that it is made of an invar (35% Ni—Fe alloy) material and has a thickness to or larger than 50% the thickness of the semiconductor chip 3 to reduce a stress applied to the semiconductor chip 3 resulting from the difference in linear expansion coefficient. "Invar" is trademark for 36% Ni—Fe ally with no thermal expansion of Imphy Ugine Precision, UK. Since the linear expansion coefficient of the semiconductor chip 3, which is 3 ppm/° C., is larger than the linear expansion coefficient of the invar, which is 1.5 ppm/° C., a difference in extension responsive to heat can be reduced by adjusting the thickness of the metal plate 9 to be larger than the thickness of the semiconductor chip 3. By increasing the thickness of the metal plate 9, skills for suppressing the deformation of the chip are also improved so that a reduced stress applied to the semiconductor chip 3 is expected. Since the semiconductor chip 3 is bonded directly to the case electrode 5, excellent heat dissipation is provided. For a reduction in thermal strain resulting from the difference in linear expansion coefficient between the semiconductor chip 3 and the case electrode 5, the first region 1a composed of the lead wire and the second region 1b thinner than the first region are also provided and the second region 1b is formed to have a thickness equal to or smaller than the thickness of the bonding member 2 adhered to the semiconductor chip 3 and the lead electrode 1, in the same manner as in the semiconductor device according to the first embodiment. In addition, the lead electrode disk edge portion 1c is formed to be thicker than the second region 1b and the thickness of the lead electrode disk edge portion 1c is not less than the thickness of the bonding member 2 and not more than three times the thickness of the bonding member 2.

Figure 6:
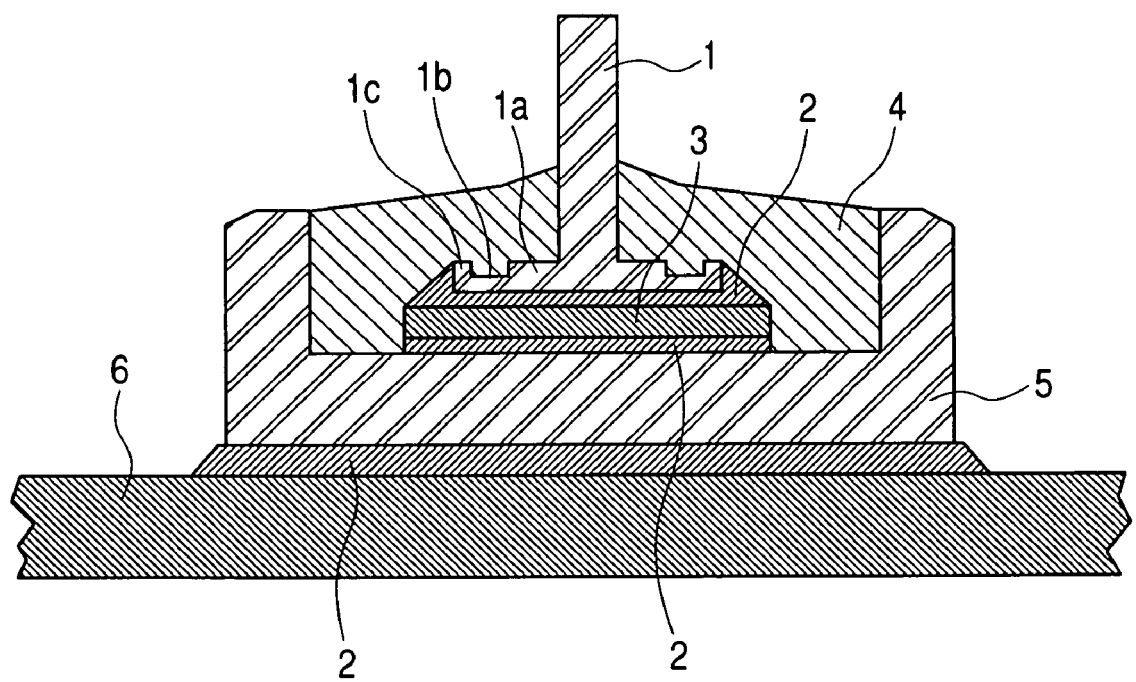
FIG. 6 is a vertical cross-sectional view of a principal portion of a semiconductor device according to a fifth embodiment of the present invention.

In a semiconductor device according to a fifth embodiment of the present invention shown in FIG. 6, the case electrode 5 is fixed to the heat radiating plate 6 with the bonding member 2 interposed therebetween when the semiconductor device according to the first embodiment shown in FIG. 1 is fixed to the heat radiating plate 6. Compared with the case where the semiconductor device is fixed to the heat radiating plate 6 by press-fitting the case electrode 5 into a hole formed in the heat radiating plate 6 to have a diameter smaller than that of the case electrode 5, a reduction in stress applied to a pellet is expected.

Thus, the use of the present invention prevents a crack caused by thermal fatigue resulting from the difference in thermal deformation between the case electrode and the semiconductor chip which are electrically bonded to each other by the bonding member and provides a semiconductor device which effects reliable heat transfer in consideration of heat dissipation.

The present invention achieves a reduction in strain in the bonding member resulting from the difference in thermal deformation between the lead electrode and the semiconductor chip and provides a semiconductor device having a semiconductor chip with enhanced heat dissipation.

What is claimed is:

1. A semiconductor device comprising:
    a lead electrode connecting to a lead wire;
    a case electrode having a projecting wall portion around a periphery thereof; and
    a semiconductor chip disposed between said lead electrode and said case electrode with a bonding member interposed therebetween,
    said lead electrode having an edge portion region formed in opposing relation to said semiconductor chip and a thinner portion region formed internally of said edge portion region to be thinner than said edge portion region.

2. The semiconductor device according to claim 1, wherein said thinner portion region has a thickness equal to or smaller than a thickness of said bonding member located between said lead electrode and said semiconductor chip.

3. The semiconductor device according to claim 1, wherein said edge portion region has a thickness equal to or smaller than three times a thickness of said bonding member located between said lead electrode and said semiconductor chip.

4. The semiconductor device according to claim 1, wherein said lead electrode further has a region thicker than said edge portion region and located internally of said edge portion region.

5. A semiconductor device comprising:
    a lead electrode connecting to a lead wire;
    a case electrode having a wall portion on an outer peripheral portion thereof; and
    a semiconductor chip disposed between said lead electrode and said case electrode with a bonding member interposed therebetween,
    said lead electrode having a trenched portion formed in a surface of said lead electrode opposite to a surface thereof opposing said semiconductor chip and extending in a circumferential direction of said electrode.

6. A semiconductor device comprising:
    a lead electrode connecting to a lead wire;
    a case electrode having a wall portion on an outer peripheral portion thereof; and
    a semiconductor chip disposed between said lead electrode and said case electrode with a bonding member interposed therebetween,
    said lead electrode having a first region located in a range to be bonded to said semiconductor chip with said bonding member interposed therebetween, a second region thinner than said first region and located at a larger distance from the lead wire than said first region, and a third region thicker than said second region and located at a larger distance from the lead wire than said second region.

7. The semiconductor device according to claim 6, wherein said second region is formed such that a first distance in a direction connecting an edge of said second region closer to the lead wire and an outer circumferential edge of said second region is equal to or smaller than 0.5 times a distance between an edge of said third region closer to said lead wire and an outer circumferential edge of said third region.

8. The semiconductor device according to claim 6, wherein said second region is formed in a range corresponding to 0.5 times or less a distance between an edge of said third region closer to said lead wire and an outer circumferential edge of said third region.

9. The semiconductor device according to claim 6, wherein said first region is formed to have a thickness equal to or less than three times a thickness of said bonding member bonded to said lead electrode.

10. The semiconductor device according to claim 1, wherein a metal plate is disposed between said lead electrode and said semiconductor chip or between said semiconductor chip and said case electrode.

* * * * *